(12) United States Patent
Tu (10) Patent No.: US 9,905,308 B2
(45) Date of Patent: Feb. 27, 2018

(54) E-FUSE DEVICE AND ARRAY THEREOF

(71) Applicant: Winbond Electronics Corp., Taichung (TW)

(72) Inventor: Ying-Te Tu, Kaohsiung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/614,154

(22) Filed: Jun. 5, 2017

(65) Prior Publication Data

US 2017/0352432 A1 Dec. 7, 2017

(30) Foreign Application Priority Data

Jun. 6, 2016 (CN) .......................... 2016 1 0395177

(51) Int. Cl.
| | | |
|---|---|---|
| *G11C 17/16* | (2006.01) | |
| *G11C 17/18* | (2006.01) | |
| *G06F 1/32* | (2006.01) | |
| *G11C 29/02* | (2006.01) | |

(52) U.S. Cl.
CPC ............... *G11C 17/16* (2013.01); *G06F 1/32* (2013.01); *G11C 17/18* (2013.01); *G11C 29/027* (2013.01)

(58) Field of Classification Search
CPC ....... G11C 17/16; G11C 17/18; G11C 29/027; G06F 1/32
See application file for complete search history.

(56) References Cited

U.S. PATENT DOCUMENTS

| | | | |
|---|---|---|---|
| 6,567,333 B2 | 5/2003 | Toda | |
| 7,224,633 B1 | 5/2007 | Hovis et al. | |
| 7,254,079 B2* | 8/2007 | Sumi ...................... | G11C 17/18 365/189.12 |
| 7,397,720 B2* | 7/2008 | Sumi ...................... | G11C 17/16 365/225.7 |
| 7,501,879 B1 | 3/2009 | Oh et al. | |
| 7,688,664 B2 | 3/2010 | Yamaguchi | |
| 8,134,854 B2* | 3/2012 | Huang ................. | H01H 37/761 365/196 |
| 9,431,128 B2* | 8/2016 | Sakamoto .............. | G11C 17/16 |
| 2014/0071770 A1 | 3/2014 | Choi | |

FOREIGN PATENT DOCUMENTS

| | | |
|---|---|---|
| TW | 200818448 A | 4/2008 |
| TW | 201209838 A1 | 3/2012 |
| TW | 201337934 A | 9/2013 |

* cited by examiner

*Primary Examiner* — Tri Hoang
(74) *Attorney, Agent, or Firm* — Muncy, Geissler, Olds & Lowe, P.C.

(57) ABSTRACT

An e-fuse device includes a transferring circuit, a detecting-and-outputting circuit, and a fusing circuit. The transferring circuit transfers an input signal to a data node. The detecting-and-outputting circuit generates an output signal according to the logic level of the data node. The fusing circuit includes an e-fuse cell, a first transistor, a second transistor, and a switch element. The e-fuse cell is coupled between a high-voltage node supplied with the high voltage or a ground and a first node. The first transistor is coupled between the first node and a second node and is controlled by the output signal. The second transistor is coupled between the second node and the ground and is controlled by a fusing signal. The switch element is coupled between the first node and the data node and is controlled by a switch signal.

20 Claims, 7 Drawing Sheets

E-FUSE DEVICE AND ARRAY THEREOF

CROSS REFERENCE TO RELATED APPLICATIONS

This Application claims priority of China Patent Application No. 201610395177.5, filed on Jun. 6, 2016, the entirety of which is incorporated by reference herein.

BACKGROUND OF THE INVENTION

Field of the Invention

The disclosure relates generally to devices for data storage, and more particularly it relates to e-fuse devices and arrays thereof.

Description of the Related Art

With the continuous shrinking scale of the memory process, conventional laser-fuse trimming devices can no longer be scaled down due to limitations in optics and mechanics, leading to the development of electrical fuse (e-fuse) trimming devices. Since an e-fuse is made of elements manufactured by a MOS process, its size can be constituted at as small as possible that can be adopted in the process. In addition, the prior art adopts an e-fuse array to achieve a smaller area occupied by the e-fuses.

Although it is theoretically possible to achieve the smallest area by the architecture of the array, real-time and high-speed requirements may not be satisfied due to uncertainty whether the fuse is melted properly, and the speed limitation of data-reading. Regarding the limitations, and the requirement to operate the memory at high speeds, the e-fuse array described above is usually operated with another static random-access memory to pre-store information related to the e-fuse array. Although the need to operate at high speeds may be theoretically satisfied by applying the static random-access memory, the cost is usually a higher power consumption, and as a result this kind of product cannot satisfy the requirement for low power consumption. In addition, a larger area is required to carry the static random-access memory. In general, although the area occupied by the e-fuses can be reduced by the e-fuse array, the overall area cannot be reduced effectively with the static random-access memory employed. In addition, in order to read information from the e-fuse array and to store it in the static random-access memory, a voltage-detecting or current-detecting circuit with extremely high sensitivity should be employed as well, resulting in the need for a larger area and a higher power consumption.

BRIEF SUMMARY OF THE INVENTION

The e-fuse device provided herein includes not only an e-fuse cell, but also a detecting-and-outputting circuit and a transferring circuit. Since the circuits are implemented by MOSs, the area occupied by the circuits is smaller and the power consumption is lower. The invention also provides an e-fuse array consisting of a plurality of e-fuse devices which are coupled in series with each other.

In an embodiment, an e-fuse device comprises: a transferring circuit, a detecting-and-outputting circuit, and a fusing circuit. The transferring circuit is coupled between an input node and a data node and configured to provide an input signal received by the input node for the data node. The detecting-and-outputting circuit is coupled between the data node and an output node and configured to detect a logic level on the data node and to generate an output signal on the output node according to the logic level on the data node. The fusing circuit is coupled to the data node, and comprises: an e-fuse cell, a first transistor, a second transistor, and a switch element. The e-fuse cell is coupled between a high-voltage node supplied with a high voltage or a ground and a first node. The first transistor is coupled between the first node and a second node and receives the output signal by using a gate terminal. The second transistor is coupled between the second node and the ground and receives a fusing signal by using a gate terminal. The switch element is coupled between the first node and the data node and receives a switch signal by using a gate terminal. The e-fuse device is operated in a fusing mode, a data-transferring mode, or a data-detecting mode. When the e-fuse device operates in the data-transferring mode, the switch element is turned OFF, the transferring circuit and the detecting-and-outputting circuit generates the output signal according to the input signal.

According to an embodiment of the invention, when the e-fuse device is operated in the fusing mode, the high-voltage node is supplied with the high voltage, the switch element is turned OFF, the second transistor is turned ON, and the fusing circuit fuses the e-fuse cell according to the fusing signal and the output signal. The fusing circuit further comprises a protection element coupled between the e-fuse cell and the first node. When the high-voltage node is supplied with the high voltage, the protection element is configured to protect the first transistor, the second transistor, and the switch element.

According to an embodiment of the invention, when the e-fuse device is operated in the data-detecting mode, the high-voltage node is coupled to the ground, the switch element is turned ON, the second transistor is turned OFF, and the detecting-and-outputting circuit detects the logic level on the data node and then outputs the output signal for determining whether the e-fuse cell is in a high-resistance state or a low-resistance state.

According to an embodiment of the invention, the detecting-and-outputting circuit comprises: a third transistor, a fourth transistor, a detecting inverter, and a fifth transistor. The third transistor is coupled between a supply voltage and a third node and receives the output signal by suing a gate terminal. The fourth transistor is coupled between the third node and the data node and receives an evaluation voltage by using a gate terminal. The evaluation voltage does not exceed the supply voltage. The detecting inverter comprises a detecting input node and a detecting output node. The detecting input node is coupled to the data node, and the detecting output node outputs the output signal. The fifth transistor is coupled between the data node and the ground and receives the output signal by using a gate terminal.

According to an embodiment of the invention, the first transistor, the second transistor, and the fifth transistor are N-type transistors, and the third transistor and the fourth transistor are P-type transistors.

According to an embodiment of the invention, the transferring circuit comprises: a first transmission gate, a first transferring inverter, a second transferring inverter, and a second transmission gate. The first transmission gate transfers the input signal to a fourth node according to a first clock signal and a first inverse clock signal. The first transferring inverter comprises a first input node and a first output node. The first input node is coupled to the fourth node, and the first output node is coupled to a fifth node. The second transferring inverter comprises a second input node and a second output node. The second input node is coupled to the fifth node, and the second output node is coupled to the fourth node. The second transmission gate electrically connects the fifth node to the data node according to a second clock signal and a second inverse clock signal.

In an embodiment, an e-fuse array comprises a plurality of the e-fuse devices. The output node of one of the e-fuse devices is coupled to the input node of another of the e-fuse devices in the data-transferring mode.

In an embodiment, an e-fuse array comprises a plurality of the e-fuse devices. The fusing signal received by the gate terminal of the second transistor of one of the e-fuse devices is the output signal generated by another one of the e-fuse devices in the data-transferring mode.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

Figure 1:
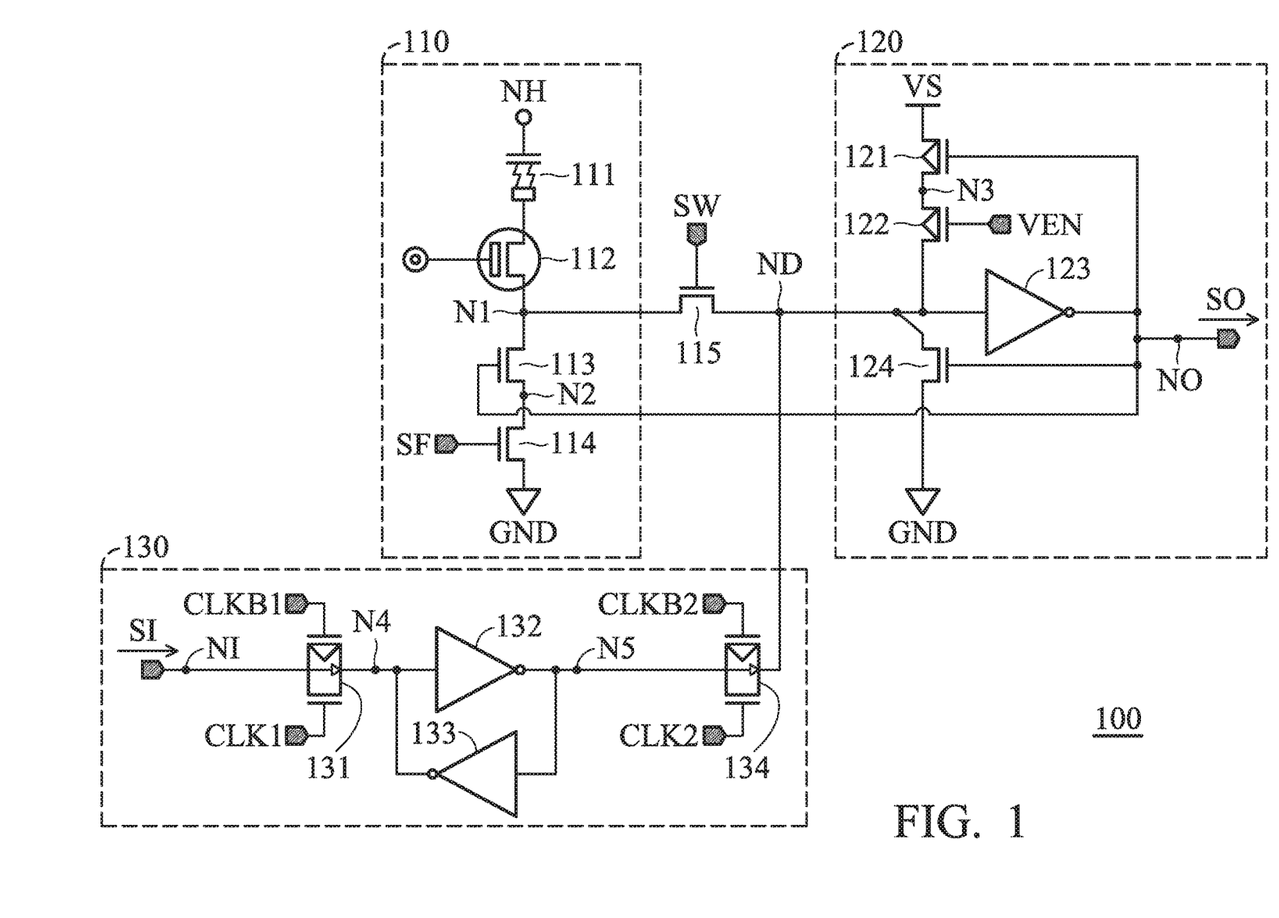
FIG. 1 is a block diagram of an e-fuse device in accordance with an embodiment of the invention.

FIG. 1 is a block diagram of an e-fuse device in accordance with an embodiment of the invention. As shown in FIG. 1, the e-fuse device 100 includes a fusing circuit 110, a switch element 115, a detecting-and-outputting circuit 120, and a transferring circuit 130. A data node ND is between the fusing circuit 110 and the detecting-and-outputting circuit 120. The fusing circuit 110 includes an e-fuse cell 111, a first transistor 113, and a second transistor 114, in which both the first transistor 113 and the second transistor 114 may be N-type transistors.

The e-fuse cell 111 is coupled between the high-voltage node NH and the first node N1, in which the high-voltage node NH is supplied with the high voltage VH or the ground GND according to different operation modes. Details of the operation will be described in the following paragraphs. The e-fuse cell 111 may include a fuse element or an anti-fuse element. The fuse element is in a low-resistance state at the beginning and changes to a high-resistance state after a high voltage is applied. Conversely, the anti-fuse element is in a high-resistance state at the beginning and changes to a low-resistance state after a high voltage is applied. According to an embodiment of the invention, the e-fuse cell 111 includes an anti-fuse element, such as a capacitive transistor element. Before being fused, the e-fuse cell 111 is equivalent to a capacitive element being in a high-resistance state. After the e-fuse cell 111 is supplied with the high voltage VH to be fused, the e-fuse cell 111 is equivalent to a resistive element being in a low-resistance state. According to other embodiments of the invention, the e-fuse cell 111 can be any other proper e-fuse element, but it is not limited thereto.

The fusing circuit 110 further includes a protection element 112, in which the protection element 112 is coupled between the e-fuse cell 111 and the first node N1. When the high-voltage node NH is supplied with the high voltage VH, the protection element 112 is configured to protect the first transistor 113, the second transistor 114, and the switch element 115. According to an embodiment of the invention, the protection element 112 is a high-voltage N-type transistor, in which the gate terminal is supplied with a high logic level to keep in turn-on state. According to other embodiments of the invention, the protection element 112 may be any other element, which can sustain high voltage, but it is not limited thereto. It should be noted that employment of the protection element 112 is optional. According to another embodiment of the invention, when the breakdown voltages of the first transistor 113, the second transistor 114, and the switch element 115 exceed the high voltage VH, the protection element 112 may be omitted. According to yet another embodiment of the invention, when the supply period of the high voltage VH to the high node NH is too short (such as, less than 1 second) to injure the first transistor 113, the second transistor 114, and the switch element 115, the protection element 112 may be omitted.

The first transistor 113 is coupled between the first node N1 and a second node N2, and the gate terminal of the first transistor 113 receives the output signal SO generated by the detecting-and-outputting circuit 120. The second transistor 114 is coupled between the second node N2 and the ground GND, and the gate terminal of the second transistor 114 receives a fusing signal SF. The switch element 115 is coupled between the first node N1 and the data node ND, and the gate terminal of the switch element 115 receives a switch signal SW.

The detecting-and-outputting circuit 120 generates the output signal SO at an output node NO according to the logic level of the data node ND. The detecting-and-outputting circuit 120 includes a third transistor 121, a fourth transistor 122, a detecting inverter 123, and a fifth transistor 124. The third transistor 121 and the fourth transistor 122 may both be a P-type transistor, and the fifth transistor 124 may be an N-type transistor.

The third transistor 121 is coupled between a supply voltage VS and a third node N3, and the gate terminal of the third transistor 121 receives the output signal SO. The fourth transistor 122 is coupled between the third node N3 and the data node ND, and the gate terminal of the fourth transistor 122 receives an evaluation voltage VEN. The evaluation voltage VEN is configured to control the ability of charging the data node ND from the third transistor 121 and the fourth transistor 122, in order to improve the sensibility of the voltage on the data node ND. According to an embodiment of the invention, the high voltage VH exceeds the supply voltage VS. According to another embodiment of the invention, when the voltage for fusing the e-fuse cell 111 is lower, the high voltage VH may not exceed the supply voltage VS, and the protection element 112 may be omitted.

The detecting inverter 123 includes a detecting input terminal and a detecting output terminal, in which the detecting input terminal of the detecting inverter 123 is coupled to the data node ND, and the detecting output terminal of the detecting inverter 123 generates the output signal SO and is coupled to the output node NO. The fifth transistor 124 is coupled between the data node ND and the ground GND. The gate terminal of the fifth transistor 124 receives the output signal SO.

The transferring circuit 130 is configured to provide an input signal SI at an input node NI to the data node ND. The transferring circuit 130 includes a first transmission gate 131, a first transferring inverter 132, a second transferring inverter 133, and a second transmission gate 134. A fourth node N4 is coupled between the first transmission gate 131 and the first transferring inverter 132. A fifth node N5 is coupled between the first transferring inverter 132 and the second transmission gate 134. The first transmission gate 131 provides the input signal SI to the fourth node N4 according to the first clock signal CLK1 and the first inverse clock signal CLKB1. The first transferring inverter 132 includes a first input node coupled to the fourth node N4 and a first output node coupled to the fifth node N5.

The second transferring inverter 133 includes a second input node coupled to the fifth node N5 and a second output node coupled to the fourth node N4. The second transmission gate 134 electrically connects the fifth node N5 to the data node ND according to the second clock signal CLK2 and the second inverse clock signal CLKB2.

According to an embodiment of the invention, the e-fuse device 100 operates in a data-transferring mode, a fusing mode, or a data-detecting mode, and details of the operation will be described in the following paragraphs. First, the e-fuse device 100 operates in the data-transferring mode, and provides, through the transferring circuit 130 and the detecting-and-outputting circuit 120, the input signal SI received by the input node NI for the data node ND to generate the output signal SO at the output node NO. At this time, the switch signal SW, the evaluation voltage VEN, the high-voltage node NH, and the fusing signal SF are both at the low logic level. The switch element 115 is turned OFF according to the switch signal SW in the low logic level, and the first transmission gate 131 transmits the input signal SI to the fourth node N4 according to the first clock signal CLK1 and the first inverse clock signal CLKB1.

The first transferring inverter 132 and the second transferring inverter 133 constitute a latch circuit configured to latch the data at the fourth node N4 and provide the inverse of the data at the fourth node N4 to the fifth node N5. The second transmission gate 134 then provides the data of the fifth node N5 to the data node ND according to the second clock signal CLK2 and the second inverse clock signal CLKB2.

As stated above, the transferring circuit 130 is coupled to the detecting-and-outputting circuit 120 through the data node ND. Therefore, in the data-transferring mode, the transferring circuit 130, which is accompanied by the detecting-and-outputting circuit 120, generates, according to the first clock signal CLK1, the first inverse clock signal CLKB1, the second clock signal CLK2, and the second inverse clock signal CLKB2, the output signal SO at the output node NO in response to the input signal SO. Then, in the fusing mode, whether the e-fuse cell 111 is fused or not is determined according to the output signal SO generated in the data transferring mode and the fusing signal SF. According to an embodiment of the invention, the transferring circuit 130 and the detecting-and-outputting circuit 120 constitute a D-type flip-flop.

When the e-fuse device 100 is operated in the fusing mode, the high-voltage node NH is supplied with the high voltage VH, and the second transistor 114 is turned ON according to the fusing signal SF. In addition, the switch signal SW, the evaluation voltage VEN, the first clock signal CLK1, and the second clock signal CLK2 are in the low logic level, and the input signal SI remains the same. The switch element 115 is turned OFF according to the switch signal SW in the low logic level.

In the fusing mode, when the output signal SO is in the high logic level, the first transistor 113 receives the output signal SO to electrically connect the first node N1 to the second node N2, and the gate terminal of the second transistor 114 receives the fusing signal SF to electrically connect the second node N2 to the ground GND, whereby the e-fuse cell 111 is fused by being electrically connected between the high voltage VH and the ground GND. According to an embodiment of the invention, the fusing signal SF is configured to control the fusing period of the e-fuse cell 111. When the e-fuse cell 111 is fused to be in the low-resistance state, the high voltage VH of the high-voltage node NH is supplied to the first node N1 through the e-fuse cell 111 which is in the low-resistance state. The protection element 112 is configured to adjust the voltage provided to the first node N1 from the high-voltage node NH so that the high voltage VH is supplied to the first node N1 to prevent the first transistor 113, the second transistor 114, and the switch element 115 from being damaged due to the high voltage VH.

In the fusing mode, when the output signal SO is in the low logic level, the first transistor 113 is turned OFF according to the output signal SO, so that the first node N1 operates in the floating state. Therefore, the e-fuse cell 111 isn't fused and maintains a high-resistance state.

According to an embodiment of the invention, by employing the transferring circuit 130, the signal indicating whether the e-fuse cell 111 is fused or not can be pre-stored in the detecting-and-outputting circuit 120. By employing the first transistor 113 in the fusing circuit 110 that is turned ON/OFF by the output signal SO, in the fusing mode, whether the e-fuse cell 111 is fused or not is determined by the output signal SO pre-stored in the detecting-and-outputting circuit 120. Therefore, pre-storing the signal indicating whether the e-fuse cell 111 is fused or not can be achieved without an additional static random-access memory, such that the overall area and power consumption can be reduced.

When the e-fuse device 100 is operated in the data-detecting mode, the high-voltage node NH is coupled to the ground GND, the switch element 115 is turned ON according to the switch signal SW in the high logic level, and the second transistor 114 is turned OFF according to the fusing signal SF in the low logic level. That is, the data node ND is coupled to the ground GND through the e-fuse cell 111. In addition, the first clock signal CLK1 and the second clock signal CLK2 are both in the low logic level. The evaluation voltage VEN is at the middle voltage VM, in which the middle voltage VM may be any voltage between the supply voltage VS and the ground GND.

According to an embodiment of the invention, in the data-detecting mode, the detecting and the outputting circuit 120 could be coupled to the e-fuse cell 111 through the switch element 115 to detect whether the e-fuse cell 111 is in the high-resistance state or the low-resistance state to generate the corresponding output signal SO. In the data-transferring mode, the transferring circuit 130 transfers the input signal SI to the output node NO with the aid of the detecting-and-outputting circuit 120 to generate the output signal SO configured to turn the first transistor 113 ON/OFF. Therefore, in the data-detecting mode and the data-transferring mode, the detecting-and-outputting circuit 120 is shared to reduce the number of transistors.

According to an embodiment of the invention, the resistance state of the e-fuse cell 111 is detected when operating in the data-detecting mode. Before operating in the data-detecting mode, the e-fuse device 100 may be operated in the data-transferring mode in advance to initialize the data node ND to the high logic level. When operated in the data-detecting mode, the detecting inverter 123 inverts the high logic level of the data node ND to generate the output signal SO in the low logic level, the third transistor 121 supplies the supply voltage VS to the third node N3 according to the output signal SO being in the low logic level, and the fourth transistor 122 electrically connects the third node N3 to the data node ND according to the evaluation voltage VEN. That is, the supply voltage VS charges the data node ND to keep the data node ND being in the high logic level. However, the first transistor 113 is turned OFF by the output signal SO which is in the low logic level, so that the first node N1 is not coupled to the second node N2. When the e-fuse cell 111 is fused in the fusing mode to be in the low-resistance state, the data node ND is coupled to the e-fuse cell 111 being in the low-resistance state through the turned-ON switch element 115 and further coupled to the ground GND, so that the level of the data node ND is pulled down. At this time, the detecting inverter 123 generates the output signal SO being in the high logic level according to the data node ND being in the low logic level, so that the fifth transistor 124 discharges the data node ND to the ground GND according to the output signal SO to keep the output signal SO in the high logic level. That is, in the embodiment of the invention, the e-fuse cell 111 is in the low-resistance state once the detecting-and-outputting circuit 120 detects that the output signal SO is converted from the low logic level to the high logic level in the data-detecting mode.

On the other hand, when the e-fuse cell 111 is not fused in the fusing mode and remains in the high-resistance state, the data node ND is coupled to the e-fuse cell 111 in the high-resistance state through the switch element 115, rather than being coupled to the ground GND, in the data-detecting mode, so that the data node ND remains in the high logic level and the output signal SO remains in the low logic level. That is, in the embodiment of the invention, the e-fuse cell 111 is in the high-resistance state once the detecting-and-outputting circuit 120 detects, in the data-detecting mode, that the output signal SO is unchanged.

According to an embodiment of the invention, for the e-fuse cell 111 in the high-resistance state, the evaluation voltage VEN is configured to provide a small capability of charging the data node ND to prevent the data node ND from floating. That is, when the e-fuse cell 111 is fused to be in the low-resistance state, the evaluation voltage VEN is configured to ensure that the discharging current of the data node ND exceeds the charging current through the third transistor 121 and the fourth transistor 122. When the logic level of the data node ND is ensured, the detecting inverter 123 generates the output signal SO.

Figure 2:
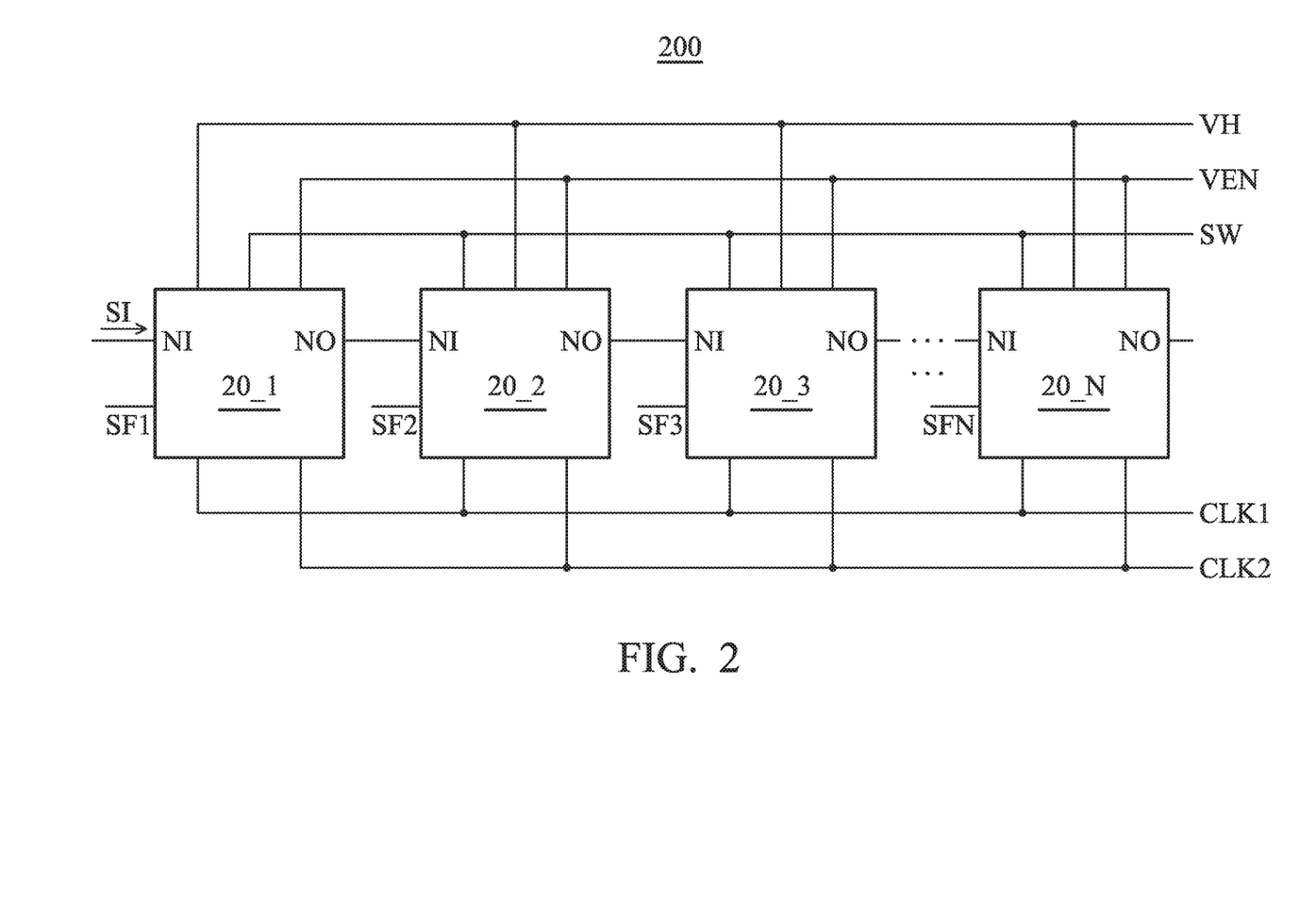
FIG. 2 is a block diagram of an e-fuse array in accordance with an embodiment of the invention.

FIG. 2 is a block diagram of an e-fuse array in accordance with an embodiment of the invention. As shown in FIG. 2, the e-fuse array 200 includes a plurality of the e-fuse devices 20_1~20_N, in which each of the e-fuse devices 20_1~20_N is the e-fuse device 100 in FIG. 1, and the output node NO is coupled to the input node NI of another e-fuse device. In addition, the evaluation voltage VEN, the switch signal SW, the first clock signal CLK1, and the second clock signal CLK2 provided to the e-fuse devices 20_1~20_N are individually coupled together to reduce the number of input pins.

According to an embodiment of the invention, the e-fuse devices 20_1~20_N can share the first inverse clock signal CLKB1 and the second inverse clock signal CLKB2 provided from two input pins. For simplicity of explanation, the first inverse clock signal CLKB1 and the second inverse clock signal CLKB2 are not shown in FIG. 2. In addition, the e-fuse devices 20_1~20_N respectively receive the first fusing signal SF1, the second fusing signal SF2, the third fusing signal SF3, . . . , and the N-th fusing signal SFN. The data-transferring mode, the fusing mode, and the data-detecting mode of the e-fuse array 200 will be described in detail in the following paragraphs.

Figure 3:
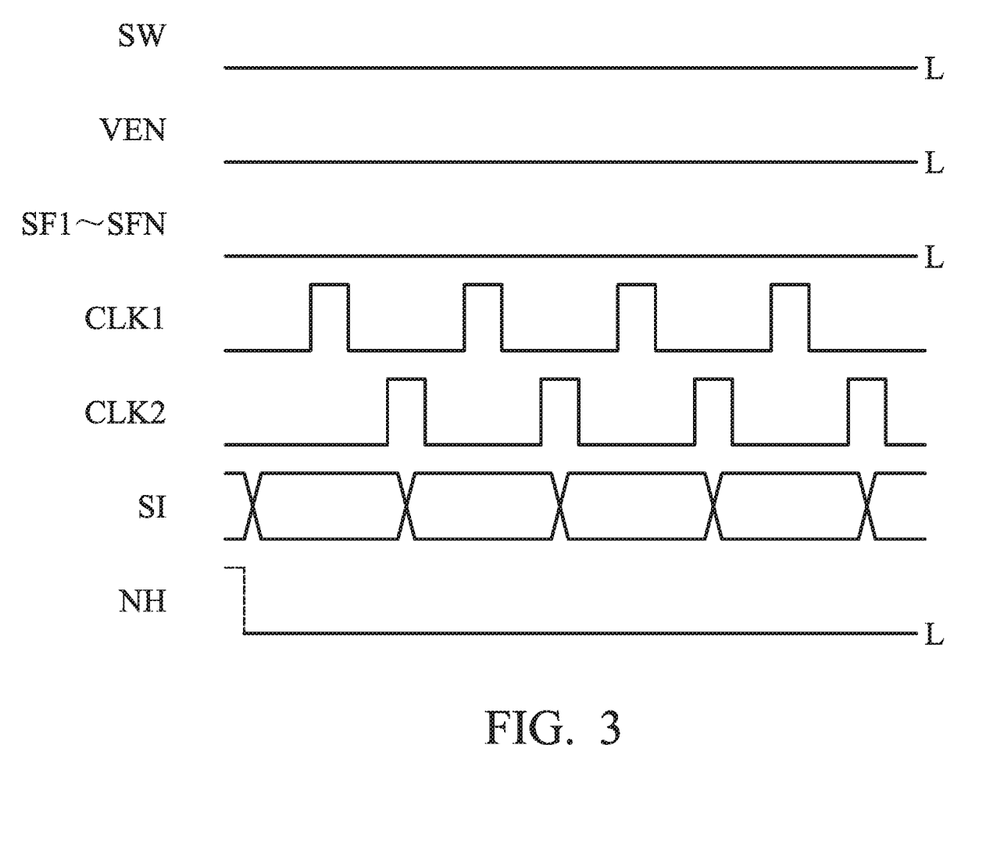
FIG. 3 is a timing diagram of an e-fuse array operating in a data-transferring mode in accordance with an embodiment of the invention.

FIG. 3 is a timing diagram of an e-fuse array operating in a data-transferring mode in accordance with an embodiment of the invention. As shown FIG. 3, when the e-fuse array 200 in FIG. 2 is operated in the data-transferring mode, the switch signal SW, the evaluation voltage VEN, the high-voltage node NH, and the first fusing signal SF1~the N-th fusing signal SFN of the e-fuse devices 20_1~20_N are in the low logic level L.

The input signal SI is sequentially input to each of the output node NO of the e-fuse devices 20_1~20_N according to the first clock signal CLK1 and the second clock signal CLK2. According to an embodiment of the invention, the output signals of the e-fuse devices 20_1~20_N that should be individually provided for the e-fuse devices 20_1~20_N can be sequentially input through the input node NI of the e-fuse device 20_1. That is, the e-fuse array 200 transfers the output signal, which is scheduled to be written to the output node NO of the e-fuse device 20_N, to the output node NO of the e-fuse device 20_N, and transfers the output signal, which is scheduled to be written to the output node NO of the e-fuse device 20_1, to the output node NO of the e-fuse device 20_1.

Figure 4:
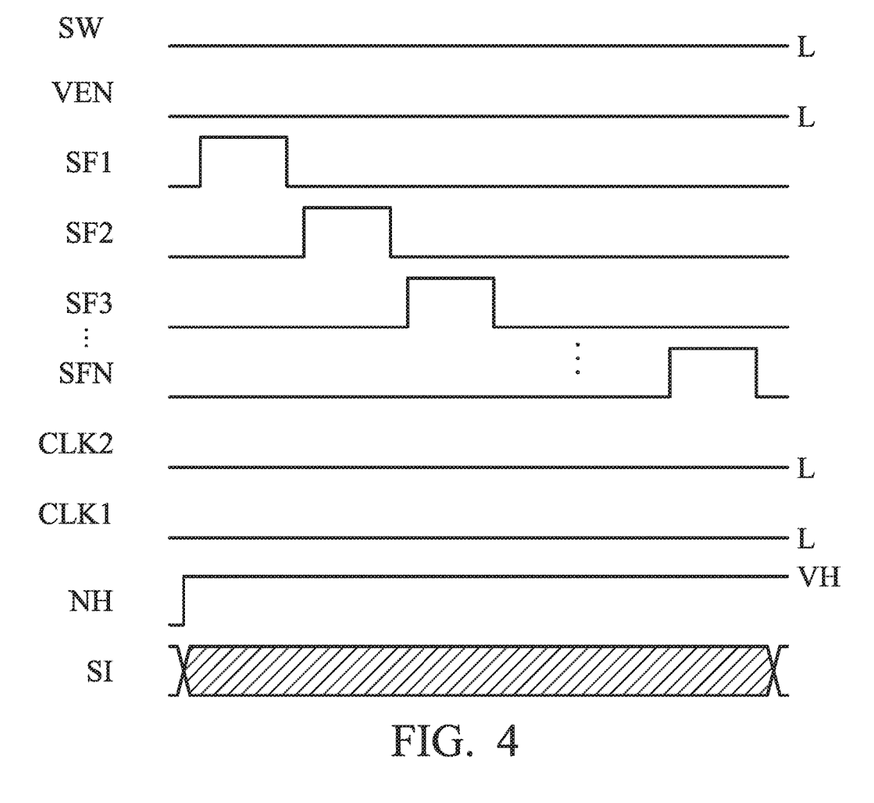
FIG. 4 is a timing diagram of an e-fuse array operating in a fusing mode in accordance with an embodiment of the invention.

FIG. 4 is a timing diagram of an e-fuse array operating in a fusing mode in accordance with an embodiment of the invention. As shown in FIG. 4, when the e-fuse array 200 is operated in the fusing mode, the switch signal SW, the evaluation voltage VEN, the first clock signal CLK1, and the second clock signal CLK2 are in the low logic level L, and the input signal SI remains the same.

According to an embodiment of the invention, after the high-voltage node NH of the e-fuse array 200 is supplied with the high voltage VH, the first fusing signal SF1, the second fusing signal SF2, the third fusing signal SF3, . . . , and the N-th fusing signal SFN are sequentially raised to the high logic level, so that the e-fuse cells of the e-fuse devices 20_1~20_N are fused one-by-one. According to another embodiment of the invention, when the current driving capability of the high voltage VH is high enough, the first fusing signal SF1, the second fusing signal SF2, the third fusing signal SF3, . . . , and the N-th fusing signal SFN can be simultaneously raised to the high logic level, so that the e-fuse cells of the e-fuse devices 20_1~20_N can be fused at the same time. According to an embodiment of the invention, the high voltage VH exceeds the supply voltage VS.

Figure 5:
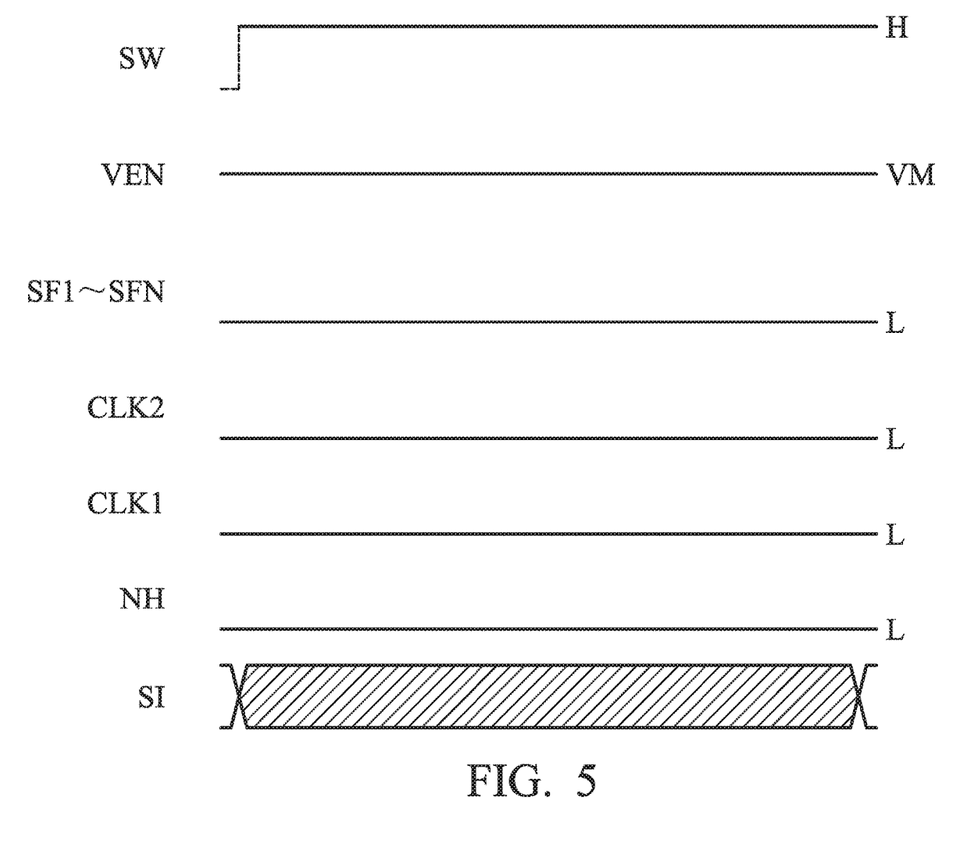
FIG. 5 is a timing diagram of an e-fuse array operating in a data-detecting mode in accordance with an embodiment of the invention.

FIG. 5 is a timing diagram of an e-fuse array operating in a data-detecting mode in accordance with an embodiment of the invention. As shown in FIG. 5, when the e-fuse array 200 is operated in the data-detecting mode, the high-voltage node NH, the first fusing signal SF1~the N-th fusing signal SFN, the first clock signal CLK1, and the second clock signal CLK2 are in the low logic level L.

The switch signal SW in the high logic level H is configured to electrically connect the detecting-and-outputting circuit 120 in FIG. 1 to the e-fuse cell 111 for detecting the resistance state of the e-fuse cell 111. The evaluation voltage VEN is in the middle voltage VM for adjusting the capability of charging the data node ND from the third transistor 121 and the fourth transistor 122, in which the middle voltage VM may be any voltage value between the supply voltage VS and the ground GND.

Figure 6:
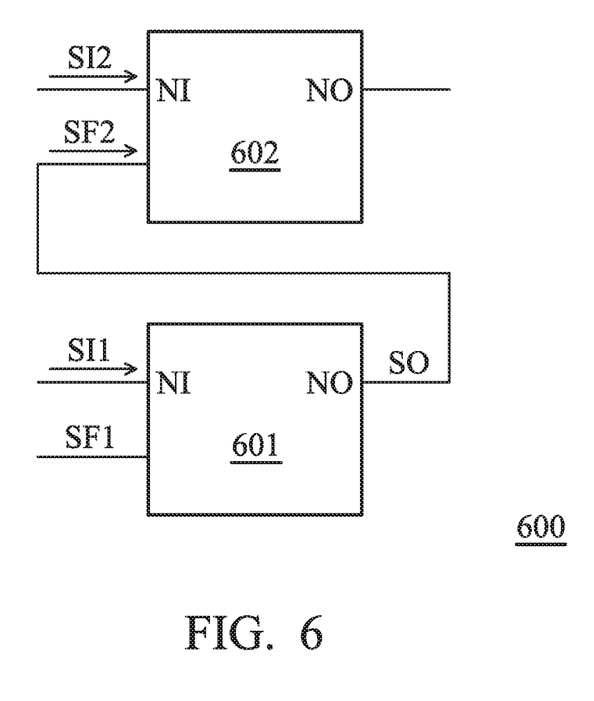
FIG. 6 is a block diagram of an e-fuse array in accordance with another embodiment of the invention.

FIG. 6 is a block diagram of an e-fuse array in accordance with another embodiment of the invention. As shown in FIG. 6, the e-fuse array 600 includes the first e-fuse device 601 and the second e-fuse device 602, in which the internal circuit of the first e-fuse device 601 and the second e-fuse device 602 is shown in FIG. 1. For simplicity of explanation, the switch signal SW, the evaluation voltage VEN, the high voltage VH, the first clock signal CLK1, and the second clock signal CLK2 of the first e-fuse device 601 and the second e-fuse device 602 are not shown herein.

As shown in FIG. 6, the output signal SO of the output node NO generated by the first e-fuse device 601 in the data-transferring mode is further provided for the gate terminal of the second transistor 114 of the second e-fuse device 602 as the second fusing signal SF2. That is, when the second e-fuse device 602 is operated in the fusing mode, the first e-fuse device 601 is operated in the data-transferring mode and provides the output signal SO as the second fusing signal SF2 for the second e-fuse device 602 according to the first clock signal CLK1, the first inverse clock signal CLKB1, the second clock signal CLK2, and the second inverse clock signal CLKB2, so that the number of pins for providing fusing signals can be reduced.

Figure 7:
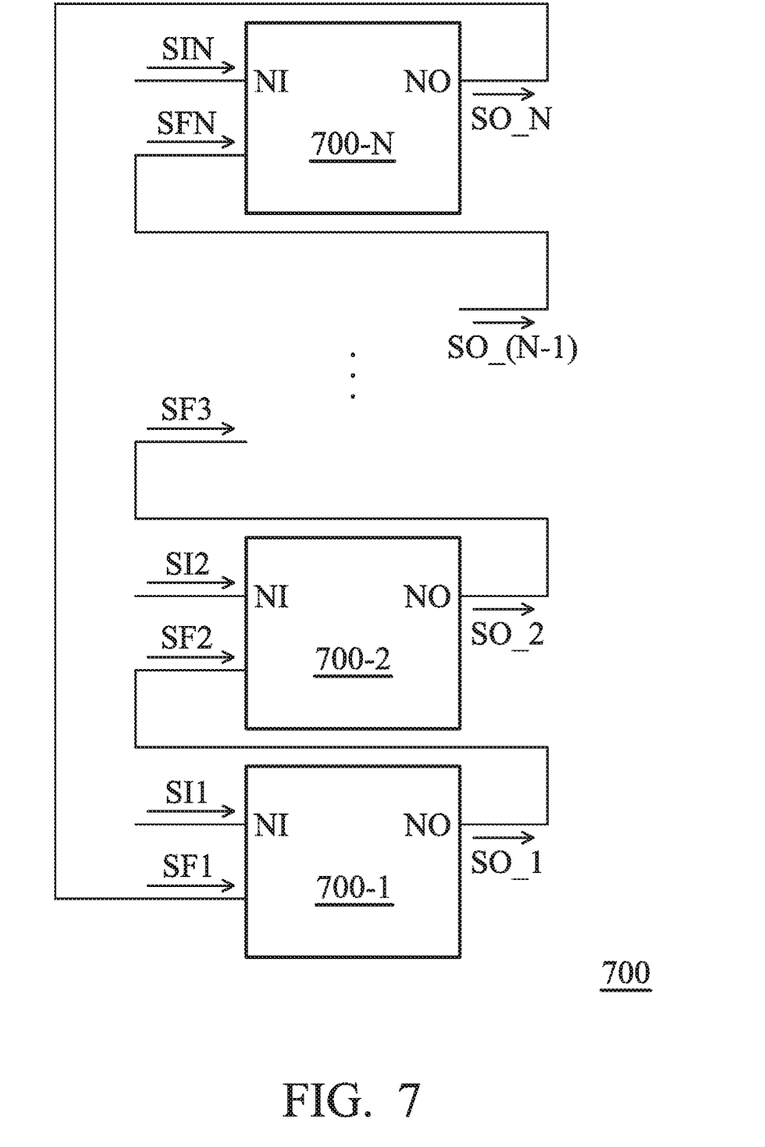
FIG. 7 is a block diagram of an e-fuse array in accordance with yet another embodiment of the invention.

FIG. 7 is a block diagram of an e-fuse array in accordance with yet another embodiment of the invention. As shown in FIG. 7, the e-fuse array 700 includes the first e-fuse device 700-1, the second e-fuse device 700-2 . . . and the N-th e-fuse device 700-N, in which the output signal of one stage is the input signal of the next stage.

That is, the first output signal SO_1 is generated by inputting the first input signal SI1 to the first e-fuse device 700-1 in the data-transferring mode, which is configured to be the second fusing signal SF2 of the second e-fuse device 700-2. The second output signal SO_2 is generated by inputting the second input signal SI2 to the second e-fuse device 700-2 in the data-transferring mode, which is configured to be the third fusing signal SF3 of the third e-fuse device 700-3. Similarly, the (N−1)-th output signal SO_(N−1) is the N-th fusing signal SFN of the N-th e-fuse device 700-N. In addition, the N-th output signal SO_N is generated by inputting the N-th input signal SIN to the N-th e-fuse device 700-N in the data-transferring mode, which is configured to be the first fusing signal SF1 of the first e-fuse device 700-1. However, the invention is not limited thereto. According to another embodiment not illustrated, the output signal of one e-fuse device may be the fusing signal of another e-fuse device.

The fusing circuit, the transferring circuit, and the voltage-detecting circuit provided herein are put together and optimized to be an independent e-fuse device which may be configured to replace the laser fuse device currently in use.

The overall circuit of the e-fuse device provided herein may be minimized by process scaling, and the additional static random-access memory and the independent voltage and/or current detecting circuit are not required. In addition, since the e-fuse device provided herein has a fusing circuit, a transferring circuit, and a voltage detecting circuit, the e-fuse device may be located anywhere based on the layout requirements without concentrating on a specific area of the layout as an array-type device. Furthermore, the laser fuse device may be directly replaced by the e-fuse device provided herein without changing the fusing process and the design concept of the accompanying circuit thereof, so that the substitution for the conventional laser fuse device is easier.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An e-fuse device, comprising:
   a transferring circuit, coupled between an input node and a data node and configured to provide an input signal received by the input node for the data node;
   a detecting-and-outputting circuit, coupled between the data node and an output node and configured to detect a logic level on the data node and to generate an output signal on the output node according to the logic level on the data node; and
   a fusing circuit, coupled to the data node, wherein the fusing circuit comprises:
      an e-fuse cell, coupled between a high-voltage node and a first node, wherein the high-voltage node is supplied with a high voltage or a ground;
      a first transistor, coupled between the first node and a second node and receiving the output signal by using a gate terminal;
      a second transistor, coupled between the second node and the ground and receiving a fusing signal by using a gate terminal; and
      a switch element, coupled between the first node and the data node and receiving a switch signal by using a gate terminal;
   wherein the e-fuse device operates in a fusing mode, a data-transferring mode, or a data-detecting mode, when the e-fuse device is operated in the data-transferring mode, the switch element is turned OFF, the transferring circuit and the detecting-and-outputting circuit generates the output signal according to the input signal.

2. The e-fuse device of claim 1, wherein, when the e-fuse device is operated in the fusing mode, the high-voltage node is supplied with the high voltage, the switch element is turned OFF, the second transistor is turned ON, and the fusing circuit fuses the e-fuse cell according to the fusing signal and the output signal.

3. The e-fuse device of claim 2, wherein the fusing circuit further comprises a protection element coupled between the e-fuse cell and the first node, when the high-voltage node is supplied with the high voltage, the protection element is configured to protect the first transistor, the second transistor, and the switch element.

4. The e-fuse device of claim 2, wherein, when the e-fuse device is operated in the data-detecting mode, the high-voltage node is coupled to the ground, the switch element is turned ON, the second transistor is turned OFF, and the detecting-and-outputting circuit detects the logic level on the data node and then outputs the output signal for determining whether the e-fuse cell is in a high-resistance state or a low-resistance state.

5. The e-fuse device of claim 4, wherein the detecting-and-outputting circuit comprises:
   a third transistor, coupled between a supply voltage and a third node and receiving the output signal by using a gate terminal;
   a fourth transistor, coupled between the third node and the data node and receiving an evaluation voltage by using a gate terminal, wherein the evaluation voltage does not exceed the supply voltage;
   a detecting inverter, comprising a detecting input node and a detecting output node, wherein the detecting input node is coupled to the data node, and the detecting output node outputs the output signal; and
   a fifth transistor, coupled between the data node and the ground and receiving the output signal by using a gate terminal.

6. The e-fuse device of claim 5, wherein the first transistor, the second transistor, and the fifth transistor are N-type transistors, and the third transistor and the fourth transistor are P-type transistors.

7. The e-fuse device of claim 1, wherein the transferring circuit comprises:
   a first transmission gate, transferring the input signal to a fourth node according to a first clock signal and a first inverse clock signal;
   a first transferring inverter, comprising a first input node and a first output node, wherein the first input node is coupled to the fourth node, and the first output node is coupled to a fifth node;
   a second transferring inverter, comprising a second input node and a second output node, wherein the second input node is coupled to the fifth node, and the second output node is coupled to the fourth node; and
   a second transmission gate, electrically connecting the fifth node to the data node according to a second clock signal and a second inverse clock signal.

8. An e-fuse array, comprising: a plurality of the e-fuse devices of claim 1; wherein the output node of one of the e-fuse devices is coupled to the input node of another one of the e-fuse devices in the data-transferring mode.

9. The e-fuse array of claim 8, wherein, when one of the e-fuse devices is operated in the fusing mode, the high-voltage node is supplied with the high voltage, the switch element is turned OFF, the second transistor is turned ON, and the fusing circuit fuses the e-fuse cell according to the fusing signal and the output signal.

10. The e-fuse array of claim 9, wherein the fusing circuit further comprises a protection element coupled between the e-fuse cell and the first node, when the high-voltage node is supplied with the high voltage, the protection element is configured to protect the first transistor, the second transistor, and the switch element.

11. The e-fuse array of claim 9, wherein, when one of the e-fuse devices is operated in the data-detecting mode, the high-voltage node is coupled to the ground, the switch element is turned ON, the second transistor is turned OFF, and the detecting-and-outputting circuit detects the logic level of the data node and generates the output signal for determining whether the e-fuse cell is in a high-resistance state or a low-resistance state.

12. The e-fuse array of claim 11, wherein the detecting-and-outputting device comprises:
   a third transistor, coupled between a supply voltage and a third node and receiving the output signal by using a gate terminal;
   a fourth transistor, coupled between the third node and the data node and receiving an evaluation voltage by using a gate terminal, wherein the evaluation voltage does not exceed the supply voltage;
   a detecting inverter, comprising a detecting input node and a detecting output node, wherein the detecting input node is coupled to the data node, and the detecting output node outputs the output signal; and
   a fifth transistor, coupled between the data node and the ground and receiving the output signal by using a gate terminal.

13. The e-fuse array of claim 12, wherein the first transistor, the second transistor, and the fifth transistor are N-type transistors, and the third transistor and the fourth transistor are P-type transistors.

14. The e-fuse array of claim 8, wherein the transferring circuit comprises:
   a first transmission gate, transferring the input signal to a fourth node according to a first clock signal and a first inverse clock signal;
   a first transferring inverter, comprising a first input node and a first output node, wherein the first input node is coupled to the fourth node, and the first output node is coupled to a fifth node;
   a second transferring inverter, comprising a second input node and a second output node, wherein the second input node is coupled to the fifth node, and the second output node is coupled to the fourth node; and
   a second transmission gate, electrically connecting the fifth node to the data node according to a second clock signal and a second inverse clock signal.

15. An e-fuse array, comprising:
   a plurality of the e-fuse devices of claim 1;
   wherein the fusing signal received by the gate terminal of the second transistor of one of the e-fuse devices is the output signal generated by another one of the e-fuse devices in the data-transferring mode.

16. The e-fuse array of claim 15, wherein, when one of the e-fuse devices is operated in the fusing mode, the high-voltage node is supplied with the high voltage, the switch element is turned OFF, the second transistor is turned ON, and the fusing circuit fuses the e-fuse cell according to the fusing signal and the output signal, the fusing circuit further comprises a protection element coupled between the e-fuse cell and the first node, and configured to protect the first transistor, the second transistor, and the switch element.

17. The e-fuse array of claim 16, wherein, when one of the e-fuse devices is operated in the data-detecting mode, the high-voltage node is coupled to the ground, the switch element is turned ON, the second transistor is turned OFF, and the detecting-and-outputting circuit detects the logic level of the data node and generates the output signal for determining whether the e-fuse cell is in a high-resistance state or a low-resistance state.

18. The e-fuse array of claim 17, wherein the detecting-and-outputting element comprises:
   a third transistor, coupled between a supply voltage and a third node and receiving the output signal by using a gate terminal;

a fourth transistor, coupled between the third node and the data node and receiving an evaluation voltage by using a gate terminal, wherein the evaluation voltage does not exceed the supply voltage;

a detecting inverter, comprising a detecting input node and a detecting output node, wherein the detecting input node is coupled to the data node, and the detecting output node outputs the output signal; and a fifth transistor, coupled between the data node and the ground and receiving the output signal by using a gate terminal.

19. The e-fuse array of claim 18, wherein the first transistor, the second transistor, and the fifth transistor are N-type transistors, and the third transistor and the fourth transistor are P-type transistors.

20. The e-fuse array of claim 15, wherein the transferring circuit comprises:

a first transmission gate, transferring the input signal to a fourth node according to a first clock signal and a first inverse clock signal;

a first transferring inverter, comprising a first input node and a first output node, wherein the first input node is coupled to the fourth node, and the first output node is coupled to a fifth node;

a second transferring inverter, comprising a second input node and a second output node, wherein the second input node is coupled to the fifth node, and the second output node is coupled to the fourth node; and a second transmission gate, electrically connecting the fifth node to the data node according to a second clock signal and a second inverse clock signal.

* * * * *